United States Patent [19]

Shay et al.

[11] Patent Number: 5,612,637
[45] Date of Patent: Mar. 18, 1997

[54] SUPPLY AND INTERFACE CONFIGURABLE INPUT/OUTPUT BUFFER

[75] Inventors: Michael J. Shay, Arlington; Mark D. Koether, Grand Prairie, both of Tex.

[73] Assignee: National Semiconductor Corporation, Santa Clara, Calif.

[21] Appl. No.: 452,365

[22] Filed: May 26, 1995

[51] Int. Cl.$^6$ .................. H03K 19/0948; H03K 19/0185
[52] U.S. Cl. .............................. 326/86; 326/50; 326/58; 326/81
[58] Field of Search .................................. 326/83, 86–87, 326/121, 27, 57–58, 33–34, 49–50, 80–81

[56] References Cited

U.S. PATENT DOCUMENTS

| | | |
|---|---|---|
| 4,472,647 | 9/1984 | Allgood et al. . |
| 5,189,319 | 2/1993 | Fung et al. . |
| 5,204,953 | 4/1993 | Dixit ........................................ 395/400 |
| 5,220,209 | 6/1993 | Seymour .................................... 326/33 |
| 5,254,888 | 10/1993 | Lee et al. . |
| 5,259,006 | 11/1993 | Price et al. .............................. 375/107 |
| 5,300,835 | 4/1994 | Assar et al. . |
| 5,332,932 | 7/1994 | Runaldue .................................. 326/33 |
| 5,341,045 | 8/1994 | Almulla .................................... 326/68 |
| 5,404,473 | 4/1995 | Papworth et al. ...................... 395/375 |
| 5,408,626 | 4/1995 | Dixit ...................................... 395/400 |

FOREIGN PATENT DOCUMENTS

| | | |
|---|---|---|
| 0482336 | 4/1992 | European Pat. Off. . |

OTHER PUBLICATIONS

Serra, Micaela & Dervisoglu, Bulent I, "Testing", Chapter 79, *The Electrical Engineering Hanbook*, Richard C. Dorf, Editor-in-Chief, pp. 1808–1837, CRC Press.

L–T Wang et al., "Feedback Shift Registers For Self–Testing Circuits", *VLSI Systems Design*, Dec. 1986.

Masakazu Shoji, "CMOS Dynamic Gates", Chapter 5, *AT&T CMOS Digital Circuit Technology*, Prentice Hall, 1988, pp. 210–257.

Guthrie, Charles, "Power–On Sequencing For Liquid Crystal Displays; Why, When, And How", *Sharp Application Notes*, Sharp Corporation, 1994, pp. 2–1 thru 2–9.

Bernd Moeschen, "NS32SP160—Feature Communication Controller Architecture Specification", *National Semiconductor*, Rev. 1.0, May 13, 1993.

Agarwal, Rakesh K., *80×86 Architecture and Programming, vol. II: Architecture Reference*, Chapter 4, Prentice Hall, 1991, pp. 542–543.

Intel486 Microprocessor Family Programmer's Reference Manual, Intel Corporation, 1993.

(List continued on next page.)

*Primary Examiner*—Edward P. Westin
*Assistant Examiner*—Jon Santamauro
*Attorney, Agent, or Firm*—Limbach & Limbach

[57] ABSTRACT

An input/output buffer including a bidirectional node, an output stage, an input stage, and a control circuit. The output stage has a first n-channel transistor coupled between the bidirectional node and a voltage supply node for pulling-up the bidirectional node, and first and second p-channel transistors coupled between the bidirectional node and the voltage supply node for pulling-up the bidirectional node. The input stage has a first inverter stage coupled between the bidirectional node and a first intermediate node and a second inverter stage coupled between the bidirectional node and a second intermediate node. The input stage also has a second n-channel transistor coupled between the first intermediate node and a ground node and a third n-channel transistor coupled between the second intermediate node and the ground node. The control circuit is coupled to the output stage and to the input stage and enables the output stage when in an output mode and disables the output stage when in an input mode. The control circuit has a first mode which disables the first and second p-channel transistors and enables the first n-channel transistor for operation with a first voltage supply level present at the voltage supply node and which the enables the second inverter stage and which turns the third n-channel transistor off.

5 Claims, 4 Drawing Sheets

OTHER PUBLICATIONS

"8237A High Performance Programmable DMA Controller (8237A, 8237A-4, 8237A-5)", *Peripheral Components*, Intel, 1992, pp. 3–14 thru 3–50.

Kane, Gerry, "R2000 Processor Programming Model", Chapter 2, *MIPS RISC Architecture*, MIPS Computer Systems, Inc.

Hennessy, John, et al., "Interpreting Memory Addresses", *Computer Architecture A Quantitative Approach*, pp. 95–97, Morgan Kaufmann Publishers, Inc. 1990.

*PowerPC601 Reference Manual*, Motorola, 1994, Chapter 9, "System Interface Operation", pp. 9–15 thru 9–17.

Intel Corp. Microsoft Corp., *Advanced Power Management- (APM) BIOS Interface Specification*, Revision 1.1, Sep. 1993.

Intel Corporation, *i486 Micro Processor Hardware Reference Manual*, Processor Bus, pp. 3–28 thru 3–32.

IBM Technical Disclosure Bulletin, vol. 36, # 6B, 1 Jun. 1993, pp. 183–185 "New PMOS Pull–Up Circuit For Dual–Power Supply".

|  | THREE | DRVCON | EN |
|---|---|---|---|
| TTL 5.0V OUTPUT | 0 | 0 | 1 |
| CMOS 5.0V OUTPUT | 0 | 1 | 1 |
| CMOS (AND TTL) 3.3V OUTPUT | 1 | X | 1 |
| TTL 5.0V INPUT | 0 | X | 0 |
| CMOS (AND TTL) 3.3V INPUT | 1 | X | 0 |

FIG. 2

SUPPLY AND INTERFACE CONFIGURABLE INPUT/OUTPUT BUFFER

BACKGROUND OF THE INVENTION

1. Field of the Invention

The present invention relates to input/output (I/O) buffers, and more particularly, to a supply and interface configurable input/output buffer.

2. Description of the Related Art

An input and/or output buffer is often used to make connections from the inside of an integrated circuit (IC) chip to devices that are external to the IC chip. Specifically, an output buffer is used to transfer signals that are generated internally in the IC chip to one of the IC chip's package pins so that the signal can be transferred to an external device. An input buffer is used to transfer a signal generated by an external device and received at one of the IC chip's package pins inside the IC chip to be used internally. A buffer which performs input and output through the same node, such as a single IC package pin, is referred to as an input/output (I/O) buffer, or simply, an I/O.

One example application of such I/Os is for connecting a DRAM controller with an external memory. In this application, the combination of high-speed, low overshoot/undershoot, and a stable noise margin are the target design specifications. In general, with respect to the output portion of an I/O, increasing the speed of the transition from low to high and high to low tends to have the disadvantage of increasing the overshoot and undershoot that is generated in a standard totem-pole output design. In I/Os that are designed to operate with two different voltage supply levels, such as for example 5 V and 3.3 V, another undesirable phenomenon occurs when the supply voltage is lowered from 5 V to 3.3 V. Specifically, the input buffer's TTL (transistor-transistor logic) trip point shifts down with the lower supply voltage on standard input structures, and the transition speed of the output buffer is degraded.

Thus, there is a need for an I/O architecture having high-speed, low overshoot/undershoot, and a stable, minimized noise margin that overcomes the disadvantages discussed above.

SUMMARY OF THE INVENTION

The present invention provides a buffer circuit which includes an output node, a first n-channel transistor coupled between the output node and a voltage supply node for pulling-up the output node, a first p-channel transistor coupled between the output node and the voltage supply node for pulling-up the output node, and a second p-channel transistor coupled between the output node and the voltage supply node for pulling-up the output node. A control circuit disables the first and second p-channel transistors and enables the first n-channel transistor for operation with a first voltage supply level present at the voltage supply node. The control circuit enables the first and second p-channel transistors for operation with a second voltage supply level present at the voltage supply node.

The present invention also provides a buffer circuit which includes a main input node and first and second intermediate nodes. A first inverter stage has an input node coupled to the main input node and an output node coupled to the first intermediate node. A first n-channel transistor is coupled between the first intermediate node and a ground node. A second inverter stage has an input node coupled to the main input node and an output node coupled to the second intermediate node. A second n-channel transistor is coupled between the second intermediate node and the ground node. A control circuit is coupled to the first and second inverter stages and to the first and second n-channel transistors. The control circuit has a first mode which enables the second inverter stage and which turns the second n-channel transistor off, and a second mode which the enables the first inverter stage and which turns the first n-channel transistor off.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 2 is a truth table illustrating the operation of the I/O buffer shown in FIG. 1.

DETAILED DESCRIPTION OF THE PREFERRED EMBODIMENT

Figure 1:
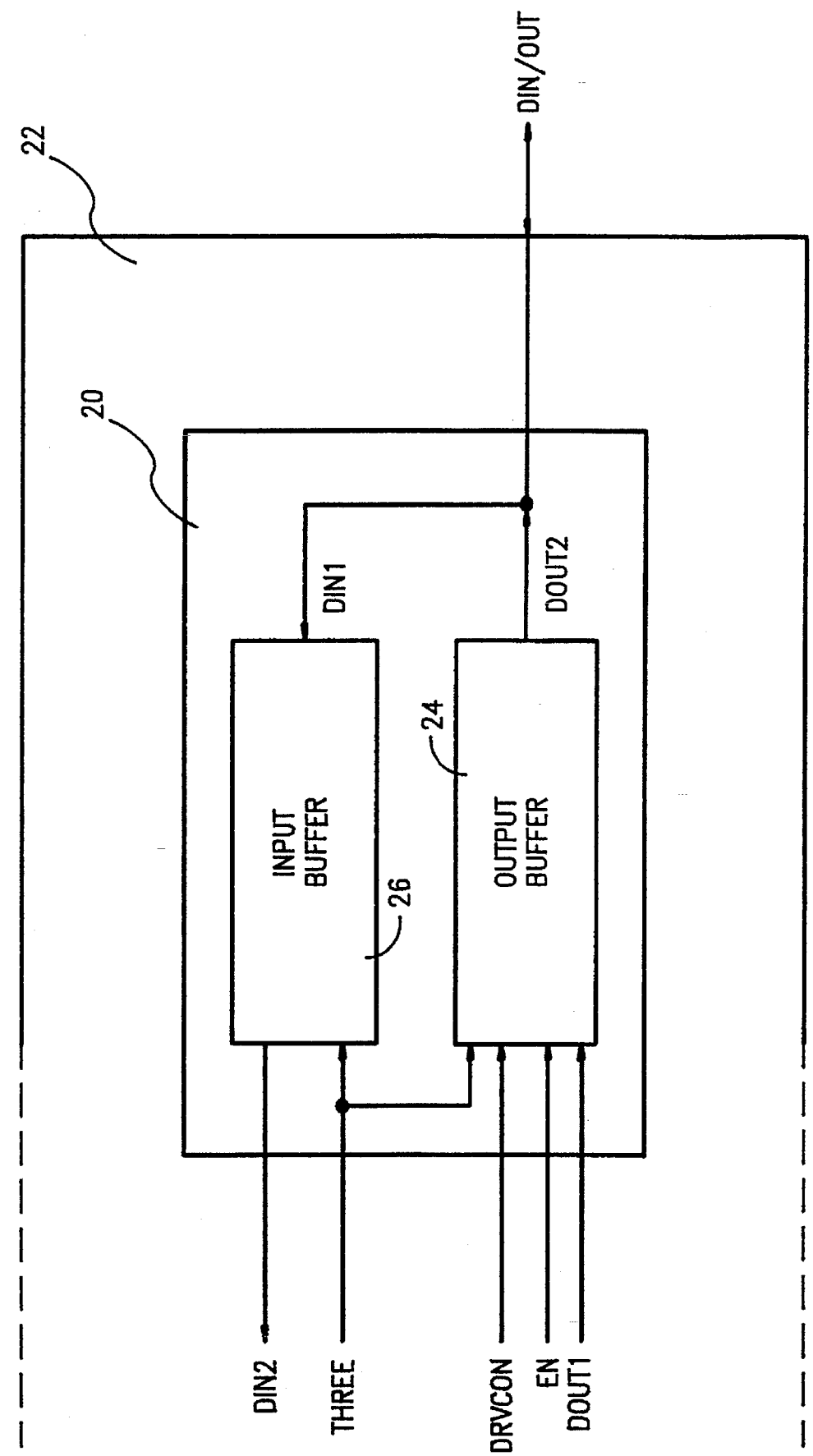
FIG. 1 is a block diagram illustrating an I/O buffer in accordance with the present invention.

Referring to FIG. 1, there is illustrated an I/O buffer 20 in accordance with the present invention. The I/O buffer 20 may be incorporated into an IC chip 22 and used to provide for the input and output of data at the DIN/OUT pin. The I/O buffer 20 includes an output buffer 24 and an input buffer 26. It should be well understood, however, that the output buffer 24 and the input buffer 26 may be used together as shown to form the bidirectional I/O buffer 20, or the output buffer 24 and the input buffer 26 may be used separately to form unidirectional output and input buffers, respectively.

In order to overcome the disadvantages discussed above, the I/O buffer 20 is configurable in its output buffer 24 drive characteristics. Furthermore, the device (i.e., transistor) ratios in the input buffer 26 are also configurable in order to adjust for changes in operating supply voltage in a mixed-voltage design.

Referring to FIG. 2, the I/O buffer 20 is configured to operate in output mode by setting the enable signal EN to a "1", i.e., logic high, and to input mode by setting the enable signal EN to a "0", i.e., logic low. When operating in input mode, the input buffer 26 is enabled and the output buffer 24 is disabled. Data is received by the IC chip 22 at the pin DIN/OUT. The pin DIN/OUT is coupled to the input buffer 26 input DIN1. The input buffer 26 sends the data to the rest of the IC chip 22 via the output DIN2. When operating in output mode, the output buffer 24 is enabled, and the input buffer 26 remains enabled but has no effect on the operation. Specifically, data generated internally by the IC chip 22 is transferred to DOUT1. The output buffer 24 sends the data to the package pin DIN/OUT via DOUT2. The data present on DOUT2 will also be sent to DIN2 via the input buffer 26, but this should have no effect on operation because the IC chip 22 is using the pin DIN/OUT as an output.

The I/O buffer 20 can be configured to operate in 5 V TTL by setting the THREE signal to a "0", i.e., logic low, and the DRVCON signal to a "0". When operating in TTL, the output buffer 24 will not pull DOUT2 all the way to the top rail. The I/O buffer 20 can be configured to operate in 5 V CMOS by setting the THREE signal to a "0", i.e., logic low, and the DRVCON signal to a "1", i.e., a logic high. When operating in CMOS, the output buffer 24 will pull DOUT2 all the way to the top rail. The I/O buffer 20 can be configured to operate in 3.3 V CMOS by setting the THREE signal to a "1". When operating in 3.3 V, the DRVCON signal has no effect on the operation. This mode of operation may also be used for 3.3 V TTL operation.

Figure 3:
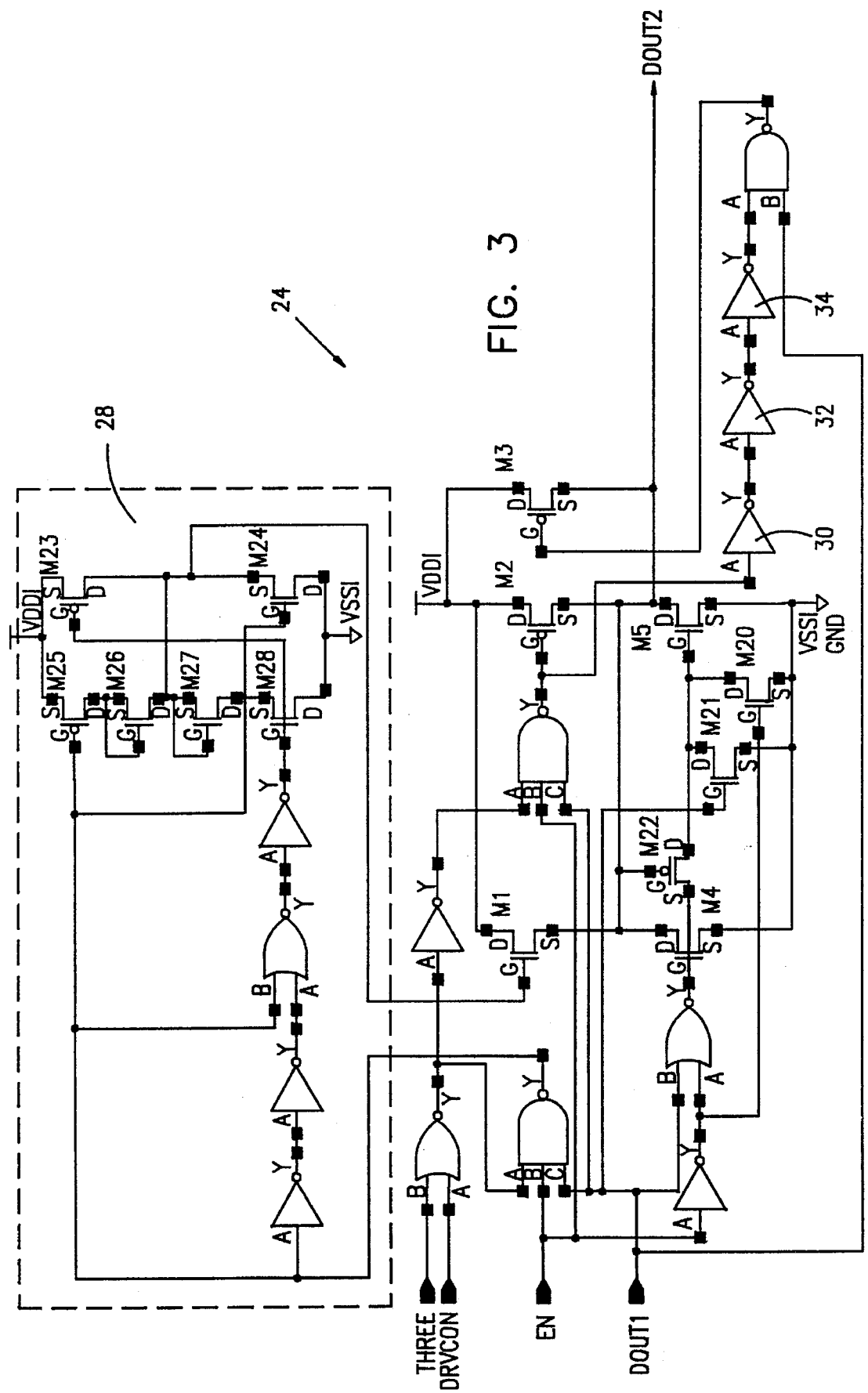
FIG. 3 is a schematic diagram illustrating the output buffer shown in FIG. 1.

Referring to FIG. 3, there is illustrated a detailed schematic of the output buffer 24. The output buffer 24 uses an n-channel pull-up transistor M1 for standard TTL 5 V operation. Transistor M1 is controlled by a voltage regulator 28 (or a slew rate control circuit 28) having a delay chain full turn-on. For 3.3 V operation a two p-channel transistor M2 and M3 pull-up approach is used. Transistor M2 is turned on first, followed by transistor M3 being turned on after a delay created by inverters 30, 32, and 34. Transistors M2 and M3 can also be used at 5 V in order to conform to CMOS levels. However, the TTL 5 V approach (i.e., pull-up transistor M1) is superior in speed and limiting overshoot and supply bouncing.

For both 3.3 V and 5 V operation the same pull-down approach may be used. Specifically, one n-channel transistor M4 turns on immediately, and then another n-channel transistor M5 is turned on via feedback. It should be understood, however, that many different pull-down approaches may be used in accordance with the present invention, and that transistors M4 and M5 are just one example approach.

Figure 4:
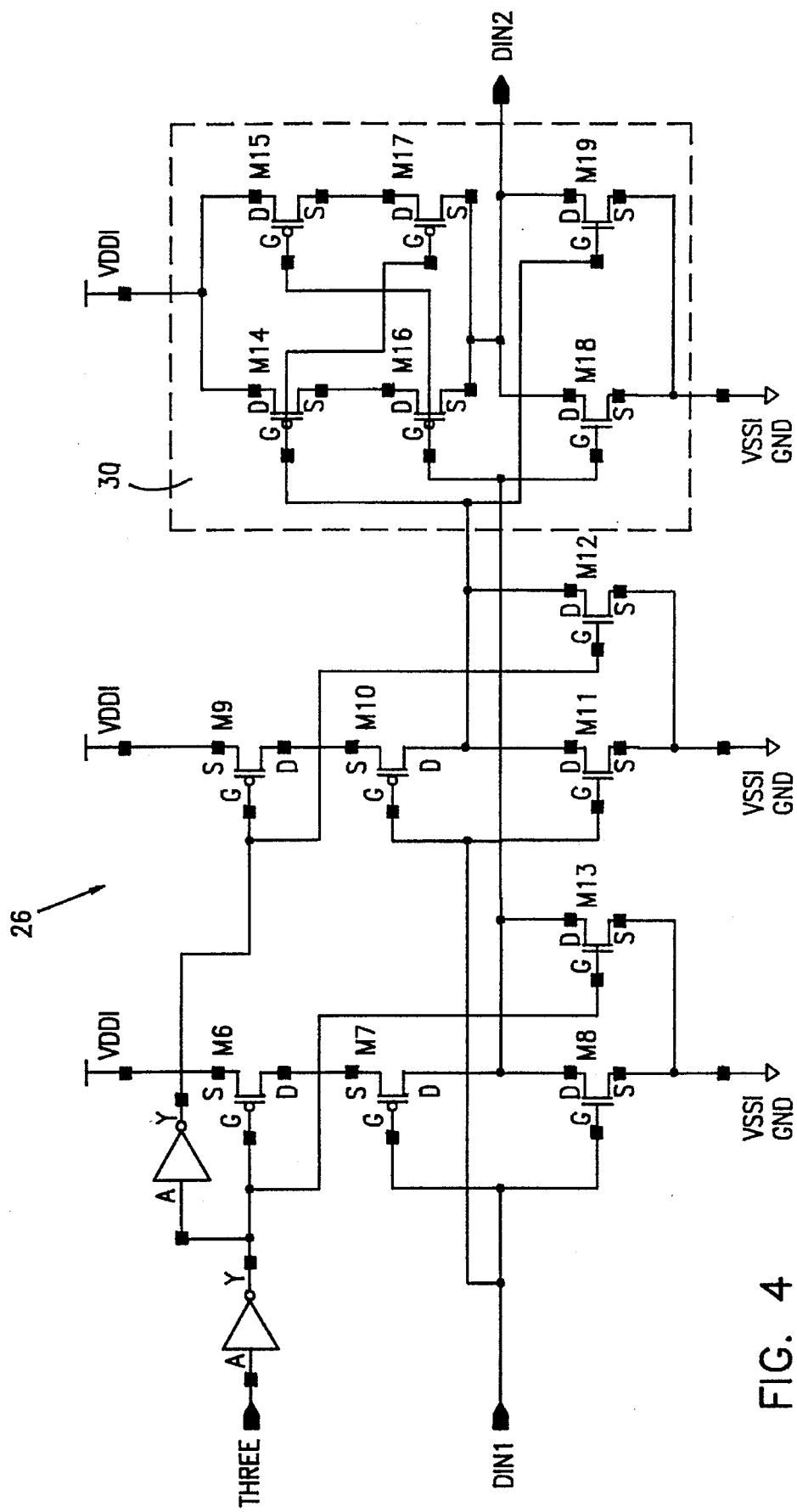
FIG. 4 is a schematic diagram illustrating the input buffer shown in FIG. 1.

Referring to FIG. 4, there is illustrated a detailed schematic of the input buffer 26. Data is received at DIN1, and data is output at DIN2. The last stage of the input buffer 26 is a NOR gate 30. The first stage of the input buffer 26 is selectable between one tuned for 5 V operation and one tuned for 3.3 V operation. Specifically, when the THREE signal is equal to a "1", i.e., the circuit is configured for 3.3 V operation, the p-channel transistor M6 is turned on which permits the p-channel transistor M7 to be turned on when DIN1 is low. The n-channel transistor M13 is turned off. Furthermore, the p-channel transistor M9 is turned off which prevents the p-channel transistor M10 from conducting current when DIN1 is low. The n-channel transistor M12 is turned on. The n-channel transistors M8 and M11 will turn on and pull their respective drains low when DIN1 is high. Thus, one input of the NOR gate 30 is driven by transistors M7 and M8 in a totem pole fashion, and the other input of the NOR gate 30 is pulled down by transistor M12 in an open drain fashion. The ratio of transistors M7 and M8, which are used for pull up, is such that they are tuned to have a trip point which is ideal for 3.3 V operation.

On the other hand, when the THREE signal is equal to a "0", i.e., the circuit is configured for 5 V operation, transistor M7 will not conduct current, transistor M13 is turned on, transistor M10 will be able to turn on, and transistor M12 is turned off. Thus, one input of the NOR gate 30 is driven by transistors M10 and M11 in a totem pole fashion, and the other input of the NOR gate 30 is pulled down by transistor M13 in an open drain fashion. The ratio of transistors M10 and M11, which are used for pull up, is such that they are tuned to have a trip point which is ideal for 5 V operation.

By way of example, the following transistor channel sizes may be used in the input buffer 26; the channel sizes are listed as width/length in micrometers (i.e., microns): M6=24/2; M7=24/2; M8=18/2; M9=22/2; M10=22/2; M11=54/2; M12=5/1; M13=5/1; M14=18/1; M15=18/1; M16=18/1; M17=18/1; M18=36/1; and M19=36/1. Similarly, the following transistor channel sizes may be used in the output buffer 24: M1=450/1; M2=240/1; M3=300/1; M4=180/1; M5=260/1; M20=15/1; M21=30/1; M22=8/2.5; M23=10/1; M24=10/1; M25=44/1; M26=5.6/2.6; M27=16.3/2.6; and M28=25/1. It should be well understood, however, that these transistor channel sizes are given only as examples and that other channel sizes may be used in accordance with the present invention.

The invention embodiments described herein have been implemented in an integrated circuit which includes a number of additional functions and features which are described in the following co-pending, commonly assigned patent applications, the disclosure of each of which is incorporated herein by reference: U.S. patent application Ser. No. 08/451,319, entitled "DISPLAY CONTROLLER CAPABLE OF ACCESSING AN EXTERNAL MEMORY FOR GRAY SCALE MODULATION DATA" (atty. docket no. NSC1-62700); U.S. patent application Ser. No. 08/451,965, entitled "SERIAL INTERFACE CAPABLE OF OPERATING IN TWO DIFFERENT SERIAL DATA TRANSFER MODES" (atty. docket no. NSC1-62800); U.S. patent application Ser. No. 08/453,076, entitled "HIGH PERFORMANCE MULTIFUNCTION DIRECT MEMORY ACCESS (DMA) CONTROLLER" (atty. docket no. NSC1-62900); U.S. patent application Ser. No. 08/452,001, entitled "OPEN DRAIN MULTI-SOURCE CLOCK GENERATOR HAVING MINIMUM PULSE WIDTH" (atty. docket no. NSC1-63000); U.S. patent application Ser. No. 08/451,503, entitled "INTEGRATED CIRCUIT WITH MULTIPLE FUNCTIONS SHARING MULTIPLE INTERNAL SIGNAL BUSES ACCORDING TO DISTRIBUTED BUS ACCESS AND CONTROL ARBITRATION" (atty. docket no. NSC1-63100); U.S. patent application Ser. No. 08/451,924, entitled "EXECUTION UNIT ARCHITECTURE TO SUPPORT x86 INSTRUCTION SET AND x86 SEGMENTED ADDRESSING" (atty. docket no. NSC1-63300); U.S. patent application Ser. No. 08/451,444, entitled "BARREL SHIFTER" (atty. docket no. NSC1-63400); U.S. patent application Ser. No. 08/451,204, entitled "BIT SEARCHING THROUGH 8, 16, OR 32-BIT OPERANDS USING A 32-BIT DATA PATH" (atty. docket no. NSC1-63500); U.S. patent application Ser. No. 08/451,195, entitled "DOUBLE PRECISION (64-BIT) SHIFT OPERATIONS USING A 32-BIT DATA PATH" (atty. docket no. NSC1-63600); U.S. patent application Ser. No. 08/451,571, entitled "METHOD FOR PERFORMING SIGNED DIVISION" (atty. docket no. NSC1-63700); U.S. patent application Ser. No. 08/452,162, entitled "METHOD FOR PERFORMING ROTATE THROUGH CARRY USING A 32-BIT BARREL SHIFTER AND COUNTER" (atty. docket no. NSC1-63800); U.S. patent application Ser. No. 08/451,434, entitled "AREA AND TIME EFFICIENT FIELD EXTRACTION CIRCUIT" (atty. docket no. NSC1-63900); U.S. patent application Ser. No. 08/451,535, entitled "NON-ARITHMETICAL CIRCULAR BUFFER CELL AVAILABILITY STATUS INDICATOR CIRCUIT" (atty. docket no. NSC1-64000); U.S. patent application Ser. No. 08/445,563, entitled "TAGGED PREFETCH AND INSTRUCTION DECODER FOR VARIABLE LENGTH INSTRUCTION SET AND METHOD OF OPERATION" (atty. docket no. NSC1-64100); U.S. patent application Ser. No. 08/450,153, entitled "PARTITIONED DECODER CIRCUIT FOR LOW POWER OPERATION" (atty. docket no. NSC 1-64200); U.S. patent application Ser. No. 08/451,495, entitled "CIRCUIT FOR DESIGNATING INSTRUCTION POINTERS FOR USE BY A PROCESSOR DECODER" (atty. docket no. NSC1-64300); U.S. patent application Ser. No. 08/451,219, entitled "CIRCUIT FOR GENERATING A DEMAND-BASED GATED CLOCK" (atty. docket no. NSC1-64500); U.S. patent application Ser. No. 08/451,214, entitled "INCREMENTOR/DECREMENTOR" (atty. docket no. NSC1-64700); U.S. patent application Ser. No. 08/451,150, entitled "A PIPELINED MICROPROCESSOR THAT PIPELINES MEMORY REQUESTS TO AN EXTERNAL MEMORY" (atty. docket no. NSC1-64800); U.S. patent application Ser. No. 08/451,198, entitled "CODE BREAKPOINT DECODER" (atty. docket no. NSC1-64900); U.S. patent application Ser. No. 08/445,569, entitled "TWO TIER PREFETCH BUFFER STRUCTURE AND METHOD WITH BYPASS" (atty. docket no. NSC1-65000); U.S. patent application Ser. No. 08/445,564, entitled "INSTRUCTION LIMIT CHECK FOR MICROPROCESSOR" (atty. docket no. NSC1-65100); U.S. patent application Ser. No. 08/452,306, entitled "A PIPELINED MICROPROCESSOR THAT MAKES MEMORY REQUESTS TO A CACHE MEMORY AND AN EXTERNAL MEMORY CONTROLLER DURING THE SAME CLOCK CYCLE" (atty. docket no. NSC1-65200); U.S. patent application Ser. No. 08/452,080, entitled "APPARATUS AND METHOD FOR EFFICIENT COMPUTATION OF A 486™ MICROPROCESSOR COMPATIBLE POP INSTRUCTION" (atty. docket no. NSC1-65700); U.S. patent application Ser. No. 08/450,154, entitled "APPARATUS AND METHOD FOR EFFICIENTLY DETERMINING ADDRESSES FOR MISALIGNED DATA STORED IN MEMORY" (atty. docket no. NSC1-65800); U.S. patent application Ser. No. 08/451,742, entitled "METHOD OF IMPLEMENTING FAST 486™ MICROPROCESSOR COMPATIBLE STRING OPERATION" (atty. docket no. NSC1-65900); U.S. patent application Ser. No. 08/452,659, entitled "A PIPELINED MICROPROCESSOR THAT PREVENTS THE CACHE FROM BEING READ WHEN THE CONTENTS OF THE CACHE ARE IN VALID" (atty. docket no. NSC1-66000); U.S. patent application Ser. No. 08/451,507, entitled "DRAM CONTROLLER THAT REDUCES THE TIME REQUIRED TO PROCESS MEMORY REQUESTS" (atty. docket no. NSC1-66300); U.S. patent application Ser. No. 08/451,420, entitled "INTEGRATED PRIMARY BUS AND SECONDARY BUS CONTROLLER WITH REDUCED PIN COUNT" (atty. docket no. NSC1-66400); U.S. patent application Ser. No. 08/452,365, entitled "SUPPLY AND INTERFACE CONFIGURABLE INPUT/OUTPUT BUFFER" (atty. docket no. NSC1-66500); U.S. patent application Ser. No. 08/451,744, entitled "CLOCK GENERATION CIRCUIT FOR A DISPLAY CONTROLLER HAVING A FINE TUNEABLE FRAME RATE" (atty. docket no. NSC1-66600); U.S. patent application Ser. No. 08/451,206, entitled "CONFIGURABLE POWER MANAGEMENT SCHEME" (atty. docket no. NSC1-66700); U.S. patent application Ser. No. 08/452,350, entitled "BIDIRECTIONAL PARALLEL SIGNAL INTERFACE" (atty. docket no. NSC1-67000); U.S. patent application Ser. No. 08/452,094, entitled "LIQUID CRYSTAL DISPLAY (LCD) PROTECTION CIRCUIT" (atty. docket no. NSC1-67100); U.S. patent application Ser. No. 08/452,094, entitled "IN-CIRCUIT EMULATOR STATUS INDICATOR CIRCUIT" (atty. docket no. NSC1-67400); U.S. patent application Ser. No. 08/450,156, entitled "DISPLAY CONTROLLER CAPABLE OF ACCESSING GRAPHICS DATA FROM A SHARED SYSTEM MEMORY" (atty. docket no. NSC1-67500); U.S. patent application Ser. No. 08/450,726, entitled "INTEGRATED CIRCUIT WITH TEST SIGNAL BUSES AND TEST CONTROL CIRCUITS" (atty. docket no. NSC1-67600); U.S. patent application Ser. No. 08/445,568, entitled "DECODE BLOCK TEST METHOD AND APPARATUS" (atty. docket no. NSC1-68000).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A buffer circuit, comprising:
   an output node;
   a first n-channel transistor coupled between the output node and a voltage supply node for pulling-up the output node;
   a first p-channel transistor coupled between the output node and the voltage supply node for pulling-up the output node;
   a second p-channel transistor coupled between the output node and the voltage supply node for pulling-up the output node; and
   a control circuit which disables the first and second p-channel transistors and enables the first n-channel transistor for operation with a first voltage supply level present at the voltage supply node, and which enables the first and second p-channel transistors for operation with a second voltage supply level present at the voltage supply node.

2. A buffer circuit in accordance with claim 1, further comprising:
   a voltage regulator coupled to a gate of the first n-channel transistor and to the control circuit for turning the first n-channel transistor on.

3. A buffer circuit in accordance with claim 1, further comprising:
   a delay circuit coupled to a gate of the second p-channel transistor and to the control circuit for turning the second p-channel transistor on a delay time period subsequent to the first p-channel transistor being turned on.

4. An input/output buffer, comprising:
   a bidirectional node;
   an output stage having a first n-channel
   transistor coupled between the bidirectional node and a voltage supply node for pulling-up the bidirectional node, and first and second p-channel transistors coupled between the bidirectional node and the voltage supply node for pulling-up the bidirectional node;
   an input stage having a first inverter stage coupled between the bidirectional node and a first intermediate node and a second inverter stage coupled between the bidirectional node and a second intermediate node, the input stage having a second n-channel transistor coupled between the first intermediate node and a ground node and a third n-channel transistor coupled between the second intermediate node and the ground node; and
   a control circuit, coupled to the output stage and to the input stage, which enables the output stage when in an output mode and which disables the output stage when in an input mode, the control circuit having a first mode which disables the first and second p-channel transistors and enables the first n-channel transistor for operation with a first voltage supply level present at the voltage supply node and which the enables the second inverter stage and which turns the third n-channel transistor off;

wherein the control circuit includes a second mode which enables the first and second p-channel transistors for operation with a second voltage supply level present at the voltage supply node, and which enables the first inverter stage and which turns the second n-channel transistor off.

5. A buffer circuit in accordance with claim 4, wherein:

the first mode disables the first inverter stage and which turns the second n-channel transistor on; and the second mode disables the second inverter stage and which turns the first n-channel transistor on.

* * * * *